US008847371B2

(12) United States Patent
Otsuka et al.

(10) Patent No.: US 8,847,371 B2
(45) Date of Patent: Sep. 30, 2014

(54) ELECTRONIC COMPONENT MODULE INCLUDING A LEAD FRAME AND AN INSULATING RESIN HAVING A THICKNESS LESS THAN OR EQUAL TO A THICKNESS OF THE LEAD FRAME AND METHOD FOR PRODUCING SAME

(71) Applicants: Takayuki Otsuka, Tokyo (JP); Fujio Furukawa, Tokyo (JP); Ryuichi Wada, Tokyo (JP); Makoto Kitazume, Tokyo (JP); Toshiki Komiyama, Tokyo (JP)

(72) Inventors: Takayuki Otsuka, Tokyo (JP); Fujio Furukawa, Tokyo (JP); Ryuichi Wada, Tokyo (JP); Makoto Kitazume, Tokyo (JP); Toshiki Komiyama, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/758,131

(22) Filed: Feb. 4, 2013

(65) Prior Publication Data
US 2013/0200504 A1 Aug. 8, 2013

(30) Foreign Application Priority Data

Feb. 8, 2012 (JP) ................................. 2012-025124
Jun. 1, 2012 (JP) ................................. 2012-126238

(51) Int. Cl.
*H01L 23/495* (2006.01)
*H01L 23/00* (2006.01)
*H01L 23/544* (2006.01)
*H01L 21/50* (2006.01)
*H01L 23/552* (2006.01)
*H01L 23/31* (2006.01)
*H01L 21/56* (2006.01)

(52) U.S. Cl.
CPC ..... *H01L 23/495* (2013.01); *H01L 2223/54486* (2013.01); *H01L 2224/73265* (2013.01); *H01L 2224/48227* (2013.01); *H01L 2224/32225* (2013.01); *H01L 24/97* (2013.01); *H01L 23/3121* (2013.01); *H01L 21/561* (2013.01); *H01L 2224/97* (2013.01); *H01L 23/544* (2013.01); *H01L 2223/54406* (2013.01); *H01L 2223/54433* (2013.01); *H01L 23/49531* (2013.01); *H01L 2223/54426* (2013.01); *H01L 2924/19106* (2013.01); *H01L 23/49548* (2013.01); *H01L 21/50* (2013.01); *H01L 2224/48091* (2013.01); *H01L 23/552* (2013.01); *H01L 2924/19105* (2013.01)
USPC ........... 257/676; 257/666; 257/684; 257/690; 257/692

(58) Field of Classification Search
USPC .......................... 257/666, 676, 684, 690, 692
See application file for complete search history.

(56) References Cited

U.S. PATENT DOCUMENTS

| 5,796,164 | A | * | 8/1998 | McGraw et al. | ............... | 257/723 |
| 7,478,474 | B2 | | 1/2009 | Koga | | |
| 8,604,600 | B2 | * | 12/2013 | Scanlan | ........................ | 257/690 |
| 2011/0037170 | A1 | | 2/2011 | Shinohara | | |

FOREIGN PATENT DOCUMENTS

| JP | 6-310623 | 11/1994 |
| JP | 2006-332255 | 12/2006 |

(Continued)

*Primary Examiner* — Thanh V Pham
(74) *Attorney, Agent, or Firm* — IPUSA, PLLC

(57) ABSTRACT

An electronic component module includes a double-sided mounting board having a front surface and a back surface; components mounted on the front surface and the back surface of the double-sided mounting board; an insulating resin sealing the components mounted on the front surface and the back surface; and a lead frame bonded to the back surface of the double-sided mounting board. The back surface of the double-sided mounting board is sealed with the insulating resin such that the lead frame is not covered by the insulating resin, and the thickness of the insulating resin sealing the components mounted on the back surface of the double-sided mounting board is less than or equal to the thickness of the lead frame.

4 Claims, 20 Drawing Sheets

(56) References Cited

FOREIGN PATENT DOCUMENTS

| | | |
|---|---|---|
| JP | 2008-210920 | 9/2008 |
| JP | 2008-288610 | 11/2008 |
| JP | 2011-040602 | 2/2011 |

* cited by examiner

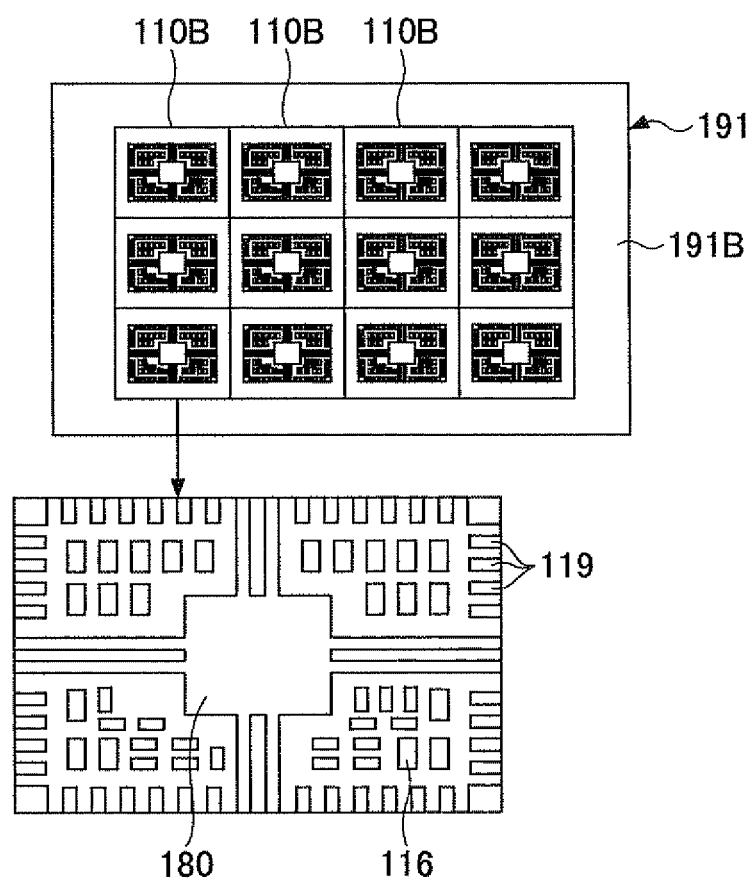

ELECTRONIC COMPONENT MODULE INCLUDING A LEAD FRAME AND AN INSULATING RESIN HAVING A THICKNESS LESS THAN OR EQUAL TO A THICKNESS OF THE LEAD FRAME AND METHOD FOR PRODUCING SAME

CROSS-REFERENCE TO RELATED APPLICATIONS

The present application is based upon and claims the benefit of priority of Japanese Patent Application No. 2012-025124 filed on Feb. 8, 2012, and Japanese Patent Application No. 2012-126238 filed on Jun. 1, 2012, the entire contents of which are incorporated herein by reference.

BACKGROUND OF THE INVENTION

1. Field of the Invention

A certain aspect of this disclosure relates to a document processing apparatus and a document processing method. More particularly, the present invention relates to a document processing apparatus and a document processing method for displaying a document having layout information in a display mode suitable for a screen, for example, on a mobile terminal.

An aspect of this disclosure relates to an electronic component module and a method for producing the electronic component module.

2. Description of the Related Art

Related-art electronic components of semiconductor integrated circuits are typically fixed to a main board via a lead frame provided on a wiring board on which the electronic components are mounted.

For example, Japanese Laid-Open Patent Publication No. 06-310623 discloses an electronic component as illustrated in FIG. 1. In an electronic component 10 of FIG. 1, a circuit component 9 is mounted on a circuit board 1, and terminals of the circuit component 9 are connected to a lead frame 4 and sealed with an insulating resin 11. The electronic component 10 is fixed to a main board via the lead frame 4. Also, Japanese Laid-Open Patent Publication No. 2011-40602 discloses an electronic device including a lead frame formed on a lower surface of a wiring board.

With the configuration of the electronic component disclosed in Japanese Laid-Open Patent Publication No. 06-310623, however, it is difficult to reduce the size and thickness of the electronic component since the lead frame protrudes from the side surfaces and the lower surface of the insulating resin. Also, with the configuration of the electronic device disclosed in Japanese Laid-Open Patent Publication No. 2011-40602, it is difficult to reduce the size of the electronic device since the contact surface between the main board and the lead frame is located (or extends) beyond the outer edge of the contact surface between the wiring board and the lead frame.

SUMMARY OF THE INVENTION

According to an aspect of this disclosure, there is provided an electronic component module that includes a double-sided mounting board having a front surface and a back surface; components mounted on the front surface and the back surface of the double-sided mounting board; an insulating resin sealing the components mounted on the front surface and the back surface; and a lead frame bonded to the back surface of the double-sided mounting board. The back surface of the double-sided mounting board is sealed with the insulating resin such that the lead frame is not covered by the insulating resin, and the thickness of the insulating resin sealing the components mounted on the back surface of the double-sided mounting board is less than or equal to the thickness of the lead frame.

BRIEF DESCRIPTION OF THE DRAWINGS

FIG. 10 is a drawing illustrating a printed wiring board according the second embodiment;

FIGS. 21A and 215 are drawings illustrating an electronic component module according to a fifth embodiment;

DESCRIPTION OF THE PREFERRED EMBODIMENTS

Preferred embodiments of the present invention are described below with reference to the accompanying drawings.

According to an aspect of this disclosure an electronic component module is configured such that a first contact surface of a lead frame to be bonded to a main board overlaps a second contact surface of the lead frame bonded to a wiring board in the vertical direction (or seen in the vertical direction).

First Embodiment

Figure 1:
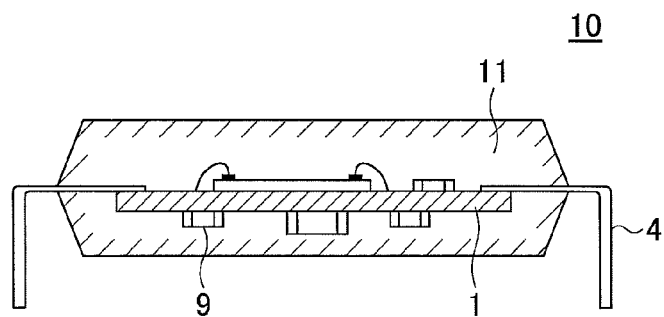
FIG. 1 is a drawing illustrating a related-art electronic component.
Figure 2:
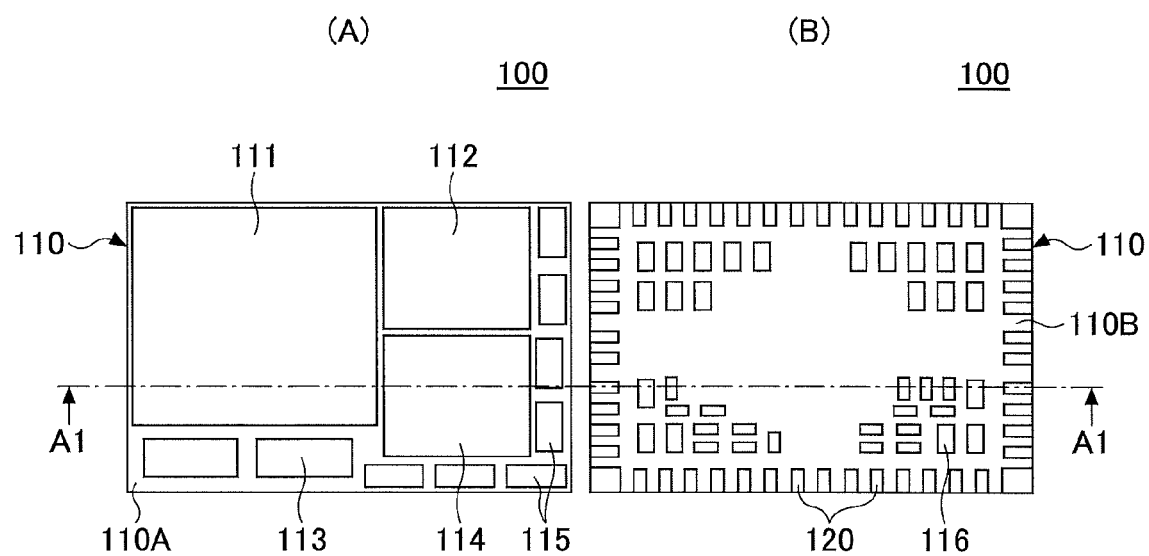
FIG. 2 is a drawing illustrating an electronic component module according to a first embodiment.

A first embodiment is described below with reference to the accompanying drawings. FIG. 2 is a drawing illustrating an electronic component module 100 according to the first embodiment. FIG. 2 (A) is a top view of the electronic component module 100 and FIG. 2 (B) is a bottom view of the electronic module 100. In FIG. 2, it is assumed that the electronic component module 100 has not been sealed with an insulating resin yet.

The electronic component module 100 of the present embodiment includes a wiring board 110 that is a double-sided mounting board having a front surface 110A and a back surface 110E on both of which electronic components are mounted. In the example of FIG. 2, integrated circuits (IC) 111, 112, 113, 114, and 115 are mounted on the front surface 110A, and components 116 such as a chip capacitor and a chip resistor are mounted on the back surface 110B.

The electronic component module 100 also includes a lead frame 120 formed on the back surface 110B of the wiring board 110. The lead frame 120 connects the integrated circuits 111 through 115 and the components 116 mounted on the wiring board 110 to a main board of a device on which the electronic component module 100 is mounted. More specifically, the lead frame 120 is bonded to terminals formed on the back surface 110E of the wiring board 110 and thereby connected to the integrated circuits 111 through 115. The lead frame 120 is bonded to a main board 200 (which is described later) and as a result, the integrated circuits 111 through 115 are connected to circuits mounted on the main board 200.

Preferably, components such as ICs with larger areas are mounted on the front surface 110A and components such as chip resistors with smaller areas are mounted on the back surface 110B.

Figure 3A:
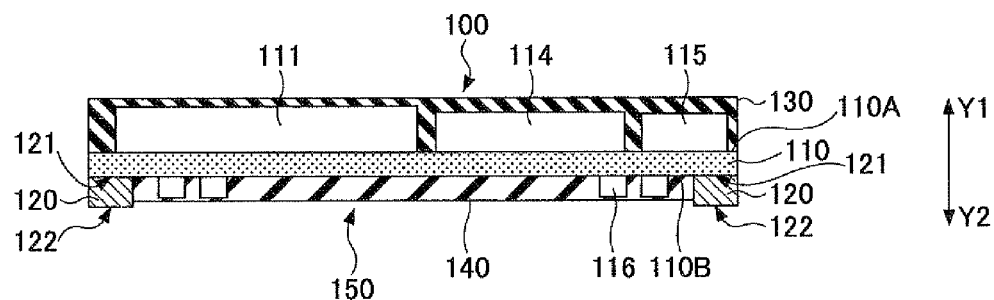
FIGS. 3A and 3B are cross-sectional views of an electronic component module according to the first embodiment taken along line A1-A1 of FIG. 2.
Figure 3B:
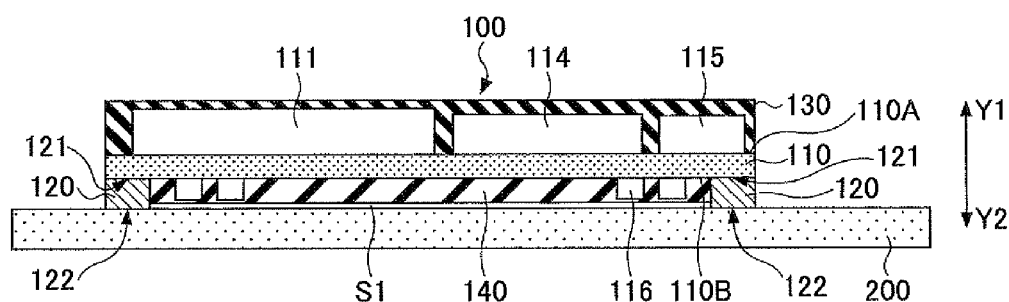

FIGS. 3A and 3B are cross-sectional views of the electronic component module 100 of the first embodiment. FIG. 3A is a cross-sectional view of the electronic component module 100 taken along line A1-A1 of FIG. 2, and FIG. 3B is a cross-sectional view of the electronic component module 100 bonded to the main board 200 taken along line A1-A1 of FIG. 2.

In the present embodiment, as illustrated in FIGS. 3A and 3B, the integrated circuits 111 through 115 mounted on the front surface 110A of the wiring board 110 are sealed with an insulating resin 130. Also in the present embodiment, the components 116 mounted on the back surface 110E are housed in a space formed by the lead frame 120 and the wiring board 110 and sealed with an insulating resin 140.

The thickness of the insulating resin 140 is preferably less than or equal to the thickness of the lead frame 120. In the example of FIGS. 3A and 3B, the thickness of the insulating resin 140 is less than the thickness of the lead frame 120. With this configuration, as illustrated in FIG. 3B, a space S1 is formed between the insulating resin 140 and the main board 200 when the electronic component module 100 is mounted on the main board 200.

In FIGS. 3A and 3B, a contact surface of the lead frame 120 that is bonded to the wiring board 110 is referred to as a surface 121 and a contact surface of the lead frame 120 that is bonded to the main board 200 is referred to as a surface 122. The lead frame 120 is formed such that the surface 121 and the surface 122 overlap each other in the vertical (Y1-Y2) direction (or when seen in the vertical direction). Preferably, the lead frame 120 may be formed such that the entire areas of the surface 121 and the surface 122 completely overlap each other in the vertical direction.

Also in the present embodiment, components such as ICs with larger areas are preferably mounted on the front surface 110A and components such as chip resistors with smaller areas are preferably mounted on the back surface 110B.

Figure 4:
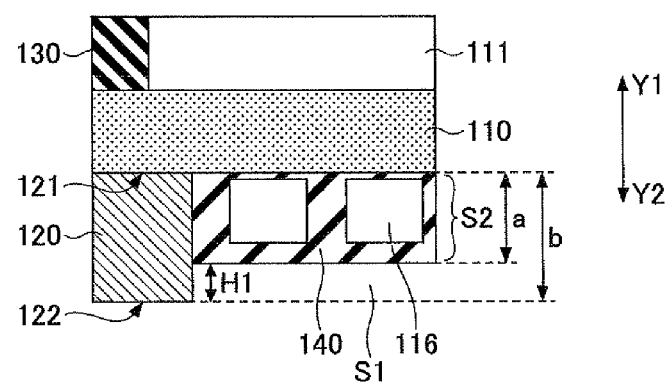
FIG. 4 is a drawing illustrating a lead frame according to the first embodiment.

FIG. 4 is an enlarged view of a part of the electronic component module 100 including the lead frame 120 illustrated in FIGS. 3A and 3B.

When thickness "a" indicates the thickness of the insulating resin 140 and thickness "b" indicates the thickness of the lead frame 120, the electronic component module 100 of the present embodiment is configured such that "a≤b" is satisfied. Accordingly, the thickness "b" of the lead frame 120 depends on the thickness of components mounted on the back surface 110B of the wiring board 110. In the example of FIG. 4, the thickness "a" is less than the thickness "b" (a<b). Here, the thickness "a" is the maximum thickness of the insulating resin 140.

In the present embodiment, when a difference H1 indicates the difference between the thickness "b" and the thickness "a", the lead frame 120 is formed so that the difference H1 becomes 0.05 mm. For example, when the thickest component mounted on the back surface 110B is a chip resistor with a thickness of 0.15 mm, the thickness "b" of the lead frame 120 is determined such that the thickness "b" is greater than the thickness "a" of the insulating resin 140 sealing the chip resistor with a thickness of 0.15 mm. More specifically, when the thickness of the chip resistor is 0.15 mm, the thickness of a part of the insulating resin 140 covering the upper surface of the chip resistor is 0.05 mm, and the thickness of a solder layer for mounting the chip resistor on the wiring board 110 is 0.02 mm (the total thickness is 0.15+0.05+0.02=0.22 mm), the thickness "b" of the lead frame 120 may be set at 0.3 mm by adding the total thickness of 0.22 mm, the difference H1 of 0.05 mm, and a thickness of 0.03 mm as a margin for variation.

When the electronic component module 100 is joined via the lead frame 120 to the main board 200, the space S1 with a height corresponding to the difference H1 is formed between the insulating resin 140 and the main board 200. According to the present embodiment, even when the main board 200 is not completely flat (or even), the irregularity in the surface of the main board 200 is absorbed by the space S1. This configuration makes it possible to achieve appropriate bonding strength between the electronic component module 100 and the main board 200.

When the main board 200 is flat, the thickness "b" may be set at any value that satisfies "a≤b".

In the present embodiment, as described above, the lead frame 120 is formed to extend vertically from the wiring board 110 toward the main board 200, and components mounted on the back surface 110B are housed in a space S2 formed by the lead frame 120 and the back surface 110B of the wiring board 110.

With this configuration, the lead frame 120 does not protrude from the side and lower surfaces of the insulating resin 140. Accordingly, this configuration makes it possible to reduce the thickness of the electronic component module 100. Also in the present embodiment, the contact surface 122 of the lead frame 120 to be bonded to the main board 200 is not located (or does not extend) beyond the outer edge of the contact surface 121 bonded to the wiring board 110. Thus, the present embodiment makes it possible to reduce the thickness of the electronic component module 100.

Next, a method of producing the electronic component module 100 is described with reference to FIGS. 5A, 5B, and 6.

Figure 5A:
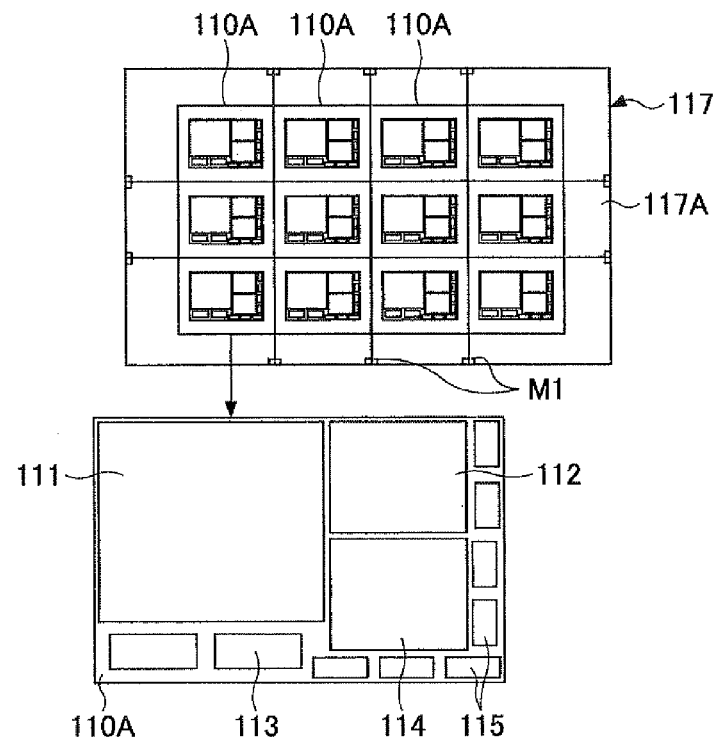
FIGS. 5A and 5B are drawings illustrating a printed wiring board according the first embodiment.
Figure 5B:
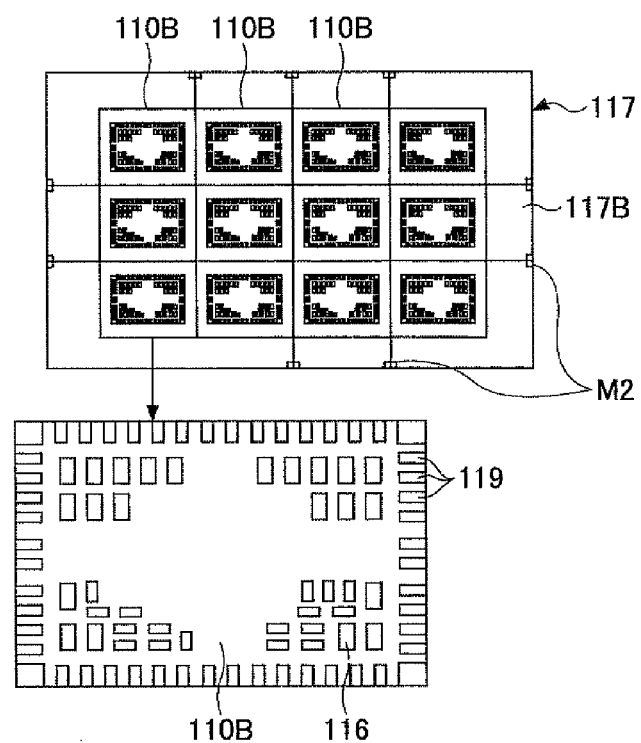

FIGS. 5A and 5B are drawings illustrating a printed wiring board of the first embodiment. In FIG. 5A, it is assumed that components are mounted on the front surface 110A of the wiring board 110 and in FIG. 5B, it is assumed that components are mounted on the back surface 110B of the wiring board 110.

In FIGS. 5A and 5B, a printed wiring board 117 is an assembly (wiring board assembly) including plural wiring boards 110. The printed wiring board 117 is cut into separate wiring boards 110. In the present embodiment, the printed wiring board 117 is shaped like a sheet.

As illustrated in FIG. 5A, a front surface 117A of the printed wiring board 117 is divided into plural areas. Each of the areas corresponds to the front surface 110A of the wiring board 110 on which the integrated circuits 111 through 115 are mounted.

As illustrated in FIG. 5B, a back surface 117B of the printed wiring board 117 is also divided into plural areas each corresponding to the back surface 110B of the wiring board 110 on which the components 116 are mounted. Also on each area (the back surface 110B) of the back surface 117B, terminals 119 are formed. The terminals 119 are connected to components including the integrated circuits 111 through 115. The terminals 119 are connected to the lead frame 120 and components including the integrated circuits 111 through 115 are thereby connected to the lead frame 120.

Figure 6:
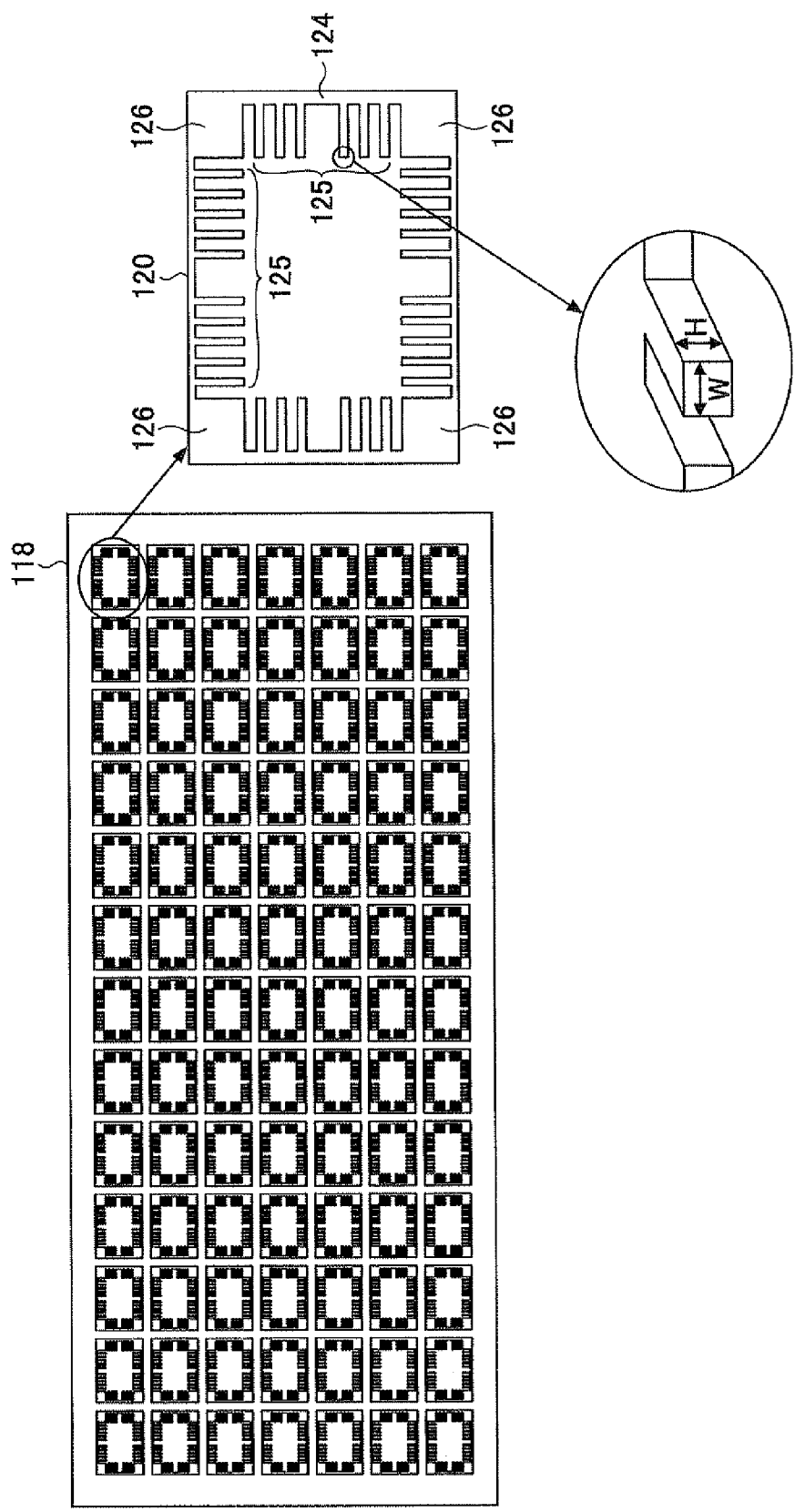
FIG. 6 is a drawing illustrating a lead frame sheet according the first embodiment.

FIG. 6 is a drawing illustrating a lead frame sheet 118 according to the first embodiment.

The lead frame sheet 118 is made of a conductive material and is an assembly of plural lead frames 120. After the lead frame sheet 118 is bonded to the printed wiring board 117, the lead frame sheet 118 is cut into separate lead frames 120 together with the printed wiring board 117. Examples of conductive materials may include copper and a copper alloy.

An exemplary configuration of the lead frame 120 is described below. The lead frame 120 of the present embodiment may include a frame 124 and leads 125 that is monolithically formed with the leads 125. The lead frame 120 may also include corner parts 126 at four corners of the frame 124 that are monolithically formed with the frame 124. The corner parts 126 formed at four corners of the frame 124 make it possible to increase the bonding strength between the wiring board 110 and the main board 200.

When W indicates the width and H indicates the thickness of each lead 125, the leads 125 are formed such that $H/W \geq 1$ is satisfied. The thickness H of the leads 125 is the same as the thickness "b" of the lead frame 120.

The lead frame sheet 118 is bonded to the printed wiring board 117 such that the leads 125 are placed on the terminals 119 on the back surface 110B.

Figure 7:
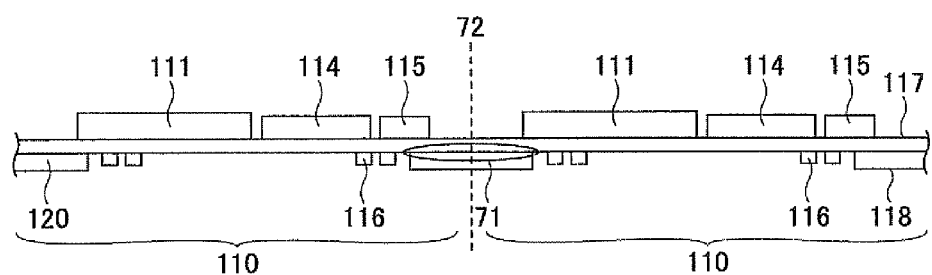
FIG. 7 is a drawing illustrating a printed wiring board and a lead frame sheet bonded together according the first embodiment.

FIG. 7 is a cut-away side view of the printed wiring board 117 and the lead frame sheet 118 bonded together according the first embodiment (which is taken along a line corresponding to line A1-A1 of FIG. 2).

In the present embodiment, the printed wiring board 117 and the lead frame sheet 118 are bonded together using, for example, a conductive adhesive. Alternatively, the printed wiring board 117 and the lead frame sheet 118 may be bonded together using a silver paste or a solder.

After the printed wiring board 117 and the lead frame sheet 118 are bonded together, components such as integrated circuits mounted on the front surface 117A are sealed with, for example, an insulating resin. Components mounted on the back surface 117B are also sealed with, for example, an insulating resin. Sealing with an insulating resin may be performed, for example, by compression molding or transfer molding.

In the present embodiment, components mounted on the back surface 117B are sealed with the insulating resin 140 such that the surface 122 of the lead frame 120 to be bonded to the main board 200 is not covered by the insulating resin 140.

After sealing, the printed wiring board 117 is cut, together with the lead frame sheet 118, at a position 72 in a connecting part 71 illustrated in FIG. 7 into separate wiring boards 110 (dicing).

A method of cutting the printed wiring board 117 into separate wiring boards 110 is described below with to FIGS. 5A and 5B.

Alignment marks M1 and M2 for determining dicing lines are formed, respectively, at the peripheries of the front surface 117A and the back surface 117B of the printed wiring board 117. The dicing lines indicate imaginary lines connecting opposing alignment marks. In the present embodiment, the alignment marks M1 and M2 are formed at predetermined positions to determine the size of the respective wiring boards 110. In the present embodiment, the printed wiring board 117 is cut along the dicing lines to produce separate wiring boards 110.

The above method makes it possible to produce the electronic component module 100 with a reduced thickness and size.

The electronic component module 100 of the present embodiment may be used, for example, for a high-frequency module for radio communications. When the present embodiment is applied to a high-frequency module, it is possible to reduce the thickness of the high-frequency module without using a component-embedded board and without complicating the configuration of the high-frequency module. Thus, the present embodiment eliminates the need to use a component-embedded board and thereby makes it possible to prevent noise caused by wiring inside of such a component-embedded board.

Second Embodiment

A second embodiment is described below with reference to the accompanying drawings. The second embodiment is different from the first embodiment in the shape of a lead frame. Below, differences from the first embodiment are mainly described. Therefore, same reference numbers are assigned to components corresponding to those in the first embodiment, and their descriptions are omitted.

Figure 8:
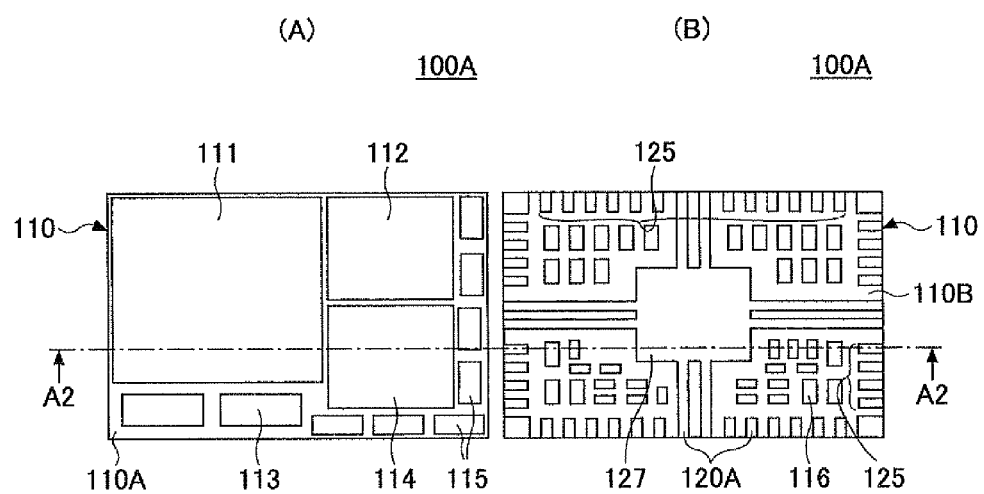
FIG. 8 is a drawing illustrating an electronic component module according to a second embodiment.

FIG. 8 is a drawing illustrating an electronic component module 100A according to the second embodiment. FIG. 8 (A) is a top view of the electronic component module 100A and FIG. 8 (B) is a bottom view of the electronic module 100A. In FIG. 8, it is assumed that the electronic component module 100A has not been sealed with an insulating resin yet.

The front surface 110A of the electronic component module 100A illustrated by FIG. 8 (A) is substantially the same as the first embodiment, and therefore its description is omitted here.

As illustrated by FIG. 8 (B), in the electronic component module 100A of the second embodiment, a lead frame 120A is formed on the back surface 110E of the wiring board 110. The lead frame 120A may include leads 125 for connecting terminals of the integrated circuits 111 through 115 to the main board 200 and a radiating part 127. The radiating part 127 transfers (or releases) heat generated by the integrated circuits 111 through 115 mounted on the front surface 110A of the wiring board 110 to the main board 200.

Figure 9A:
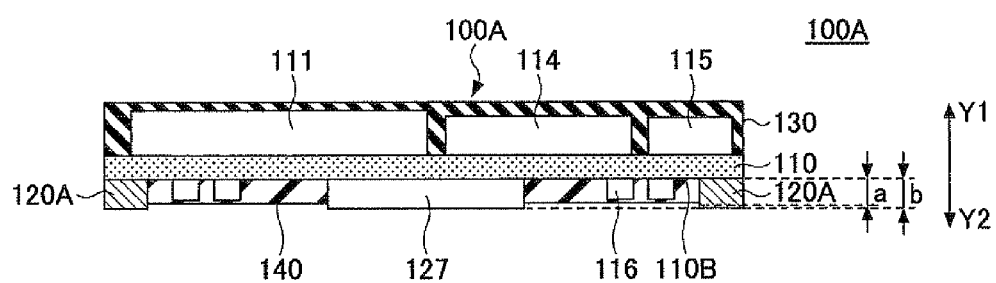
FIGS. 9A and 9B are cross-sectional views of an electronic component module according to the second embodiment taken along line A2-A2 of FIG. 8.
Figure 9B:
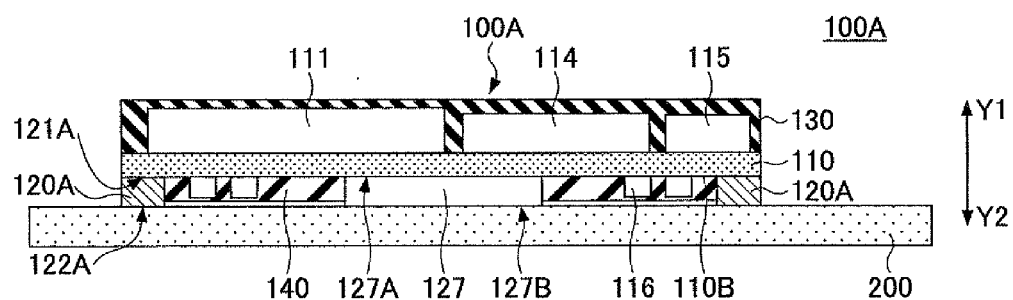

FIGS. 9A and 9B are cross-sectional views of the electronic component module 100A of the second embodiment. FIG. 9A is a cross-sectional view of the electronic component module 100A taken along line A2-A2 of FIG. 8, and FIG. 9B is a cross-sectional view of the electronic component module 100A bonded to the main board 200 taken along line A2-A2 of FIG. 8.

In the present embodiment, the components 116 mounted on the back surface 110E are housed in a space formed by the lead frame 120A and the wiring board 110 and sealed by the insulating resin 140.

When thickness "a" indicates the thickness of the insulating resin 140, thickness "b" of the lead frame 120A is set such that "a<b" is satisfied. In FIGS. 9A and 9B, a contact surface of each lead 125 of the lead frame 120A which is bonded to the wiring board 110 is referred to as a surface 121A and a contact surface of each lead 125 which is bonded to the main board 200 is referred to as a surface 122A. The lead frame 120A is formed such that the surface 121A and the surface 122A overlap each other in the vertical (Y1-Y2) direction (or when seen in the vertical direction). The lead frame 120A is also formed such that a surface 127A of the radiating part 127 which contacts the wiring board 110 and a surface 127B of the radiating part 127 which contacts the main board 200 overlap each other in the vertical (Y1-Y2) direction (or when seen in the vertical direction).

In the present embodiment, the surface 127B of the radiating part 127 is bonded to the main board 200 when the electronic component module 100A is mounted on the main board 200. With this configuration, heat generated by components mounted on the front surface 110A of the wiring board 110 is transferred to the main board 200.

Thus, the second embodiment makes it possible to efficiently transfer heat generated in the wiring board 110 to the main board 200. Also in the second embodiment, the bonding strength between the electronic component module 100A and the main board 200 is increased by bonding the surface 127B of the radiating part 127 to the main body 200.

FIG. 10 is a drawing illustrating a printed wiring board 191 of the second embodiment. In FIG. 10, it is assumed that components are mounted on the back surface B of the wiring board 110.

The printed wiring board 191 is shaped like a sheet and is an assembly (wiring board assembly) of plural wiring boards 110. The printed wiring board 191 is cut into separate wiring boards 110.

As illustrated in FIG. 10, a back surface 191E of the printed wiring board 191 is divided into plural areas each corresponding to the back surface 110B of the wiring board 110 on which the components 116 are mounted. On each area (the back surface 110B) of the back surface 191B, terminals 119 to be bonded to the leads 125 of the lead frame 120A and a radiation region 180 to be bonded to the radiating part 127 of the lead frame 120A are formed. The terminals 119 are bonded to the leads 125 and components including the integrated circuits 111 through 115 mounted on the front surface 110A are thereby connected to the lead frame 120A. With the radiation region 180 bonded to the radiating part 127, heat generated at the front surface 110A is transferred to the main board 200.

Figure 11:
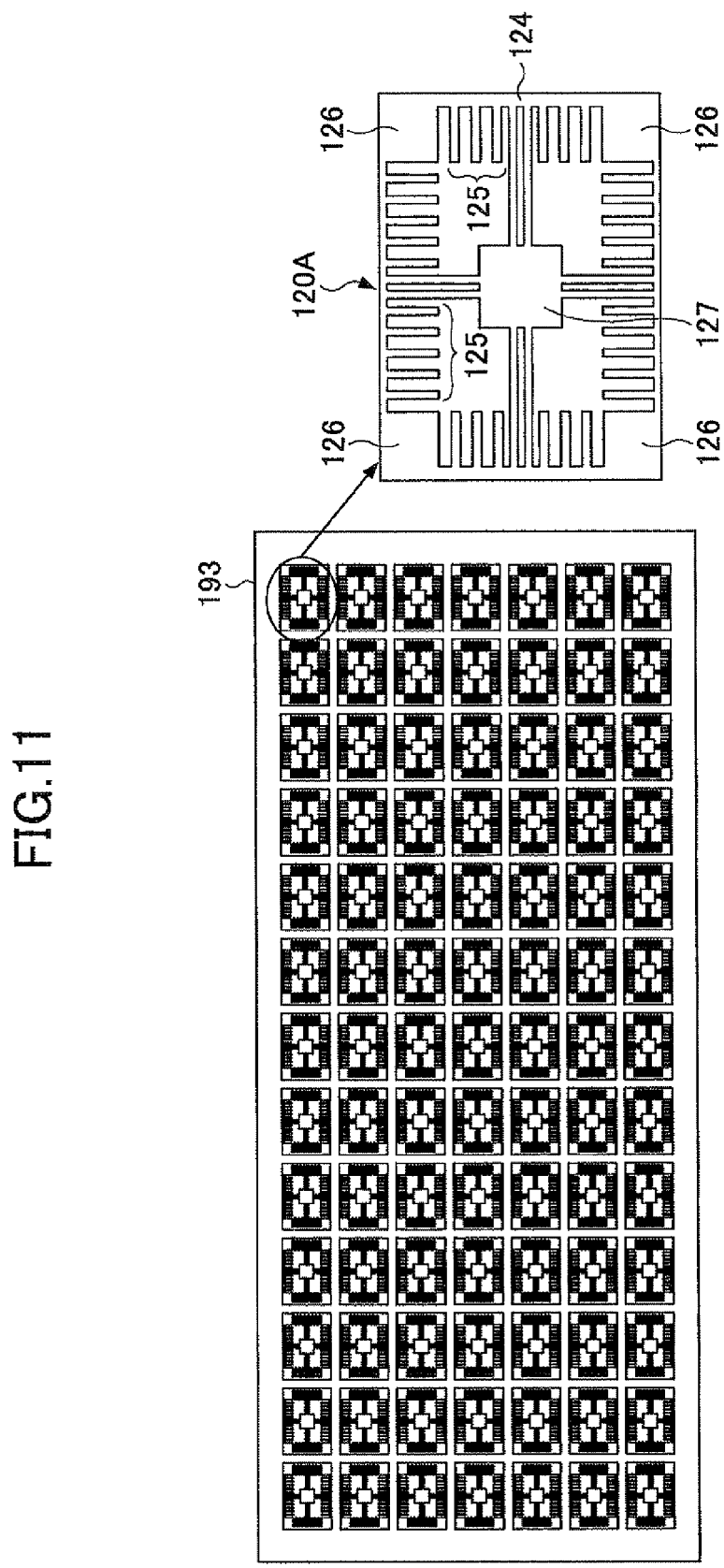
FIG. 11 is a drawing illustrating a lead frame sheet according the second embodiment.

FIG. 11 is a drawing illustrating a lead frame sheet 193 according the second embodiment.

The lead frame sheet 193 is made of a conductive material and is an assembly of plural lead frames 120A. After the lead frame sheet 193 is bonded to the printed wiring board 191, the lead frame sheet 193 is cut into separate lead frames 120A together with the printed wiring board 191.

The lead frame 120A of the present embodiment may include a frame 124 and the leads 125 that are monolithically formed with the frame 124. The lead frame 124 may also include corner parts 126 at four corners of the frame 124 that are monolithically formed with the frame 124. The lead frame 124 may further include the radiating part 127 that is monolithically formed with the leads 125.

In the example of FIG. 11, the radiating part 127 is formed substantially in the center of the frame 124. However, the radiating part 127 may be provided at any position in the frame 124.

The radiating part 127 is preferably positioned behind one of the integrated circuits 111 through 115 that generates the largest amount of heat. The area of the radiating part 127 may be determined based on the size of the integrated circuit generating the largest amount of heat or the layout of components mounted on the front surface 110A.

Figure 12:
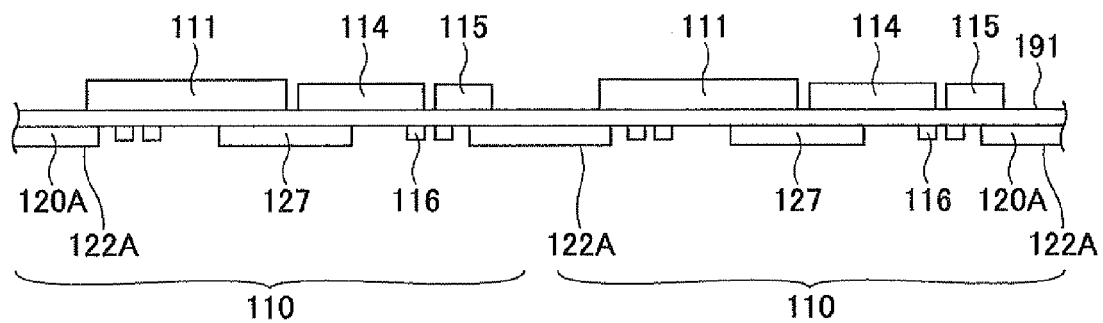
FIG. 12 is a drawing illustrating a printed wiring board and a lead frame sheet bonded together according the second embodiment.

FIG. 12 is a cut-away side view of the printed wiring board 191 and the lead frame sheet 193 bonded together according the second embodiment (which is taken along a line corresponding to line A2-A2 of FIG. 8).

In the present embodiment, the printed wiring board 191 and the lead frame sheet 193 are bonded together using, for example, a conductive adhesive. Alternatively, the printed wiring board 191 and the lead frame sheet 193 may be bonded together using a silver paste or a solder.

After the printed wiring board 191 and the lead frame sheet 193 are bonded together, components such as integrated circuits mounted on the front surface of the printed wiring board 191 are sealed by, for example, an insulating resin. Components mounted on the back surface 1913 are also sealed by, for example, an insulating resin.

In the present embodiment, components mounted on the back surface 1913 are sealed with the insulating resin 140 such that the surface 122A of the lead frame 120A to be bonded to the main board 200 is not covered by the insulating resin 140.

After sealing, the printed wiring board 191 is cut, together with the lead frame sheet 193, into separate wiring boards 110 (dicing).

Figure 13:
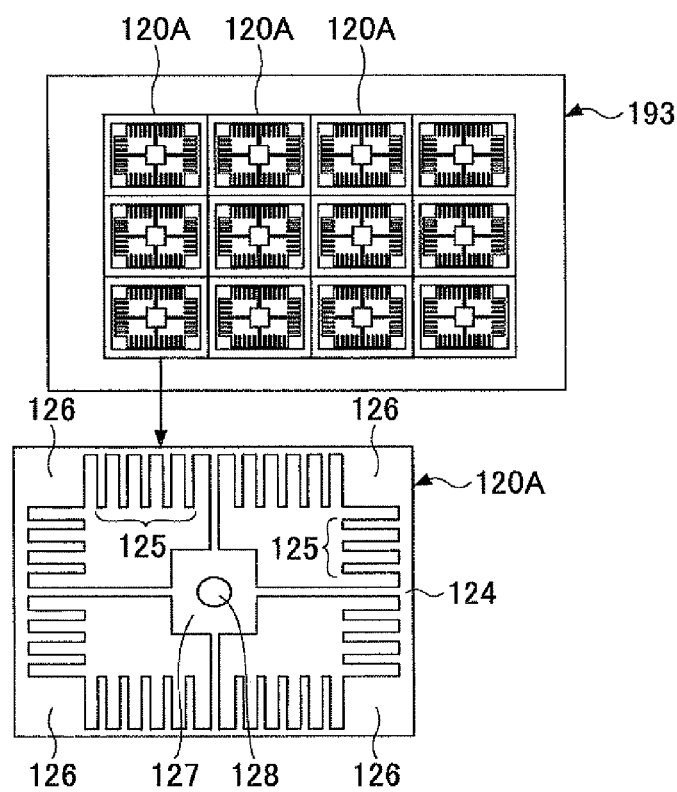
FIG. 13 is a drawing used to describe a first variation of the second embodiment.

FIG. 13 is a drawing used to describe a first variation of the second embodiment. In the first variation illustrated in FIG. 13, the lead frame sheet 193 is cut into separate lead frames 120A before bonding the lead frame sheet 193 to the printed wiring board 191.

After the lead frame sheet 193 is cut into separate lead frames 120A, a region 128 at the center of the radiating part 127 of each lead frame 120A is held by suction using a mounting device such as a chip mounter and the lead frame 120A is bonded to the corresponding front surface 110A of the printed wiring board 191. The first variation makes it possible to improve the accuracy of bonding the lead frame 120A to the wiring board 110.

Figure 14:
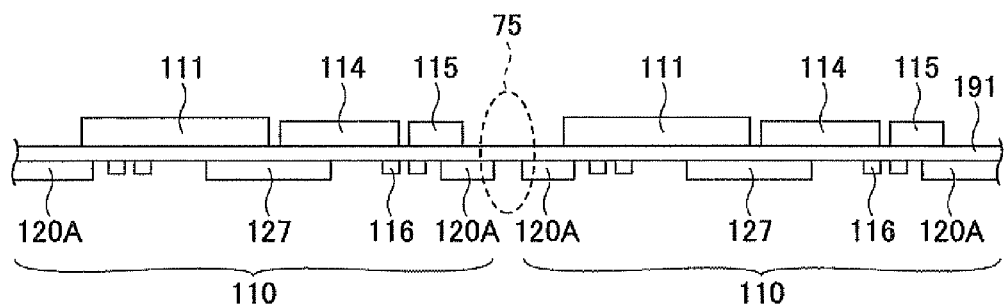
FIG. 14 is another drawing used to describe the first variation of the second embodiment.

FIG. 14 is another drawing used to describe the first variation of the second embodiment. FIG. 14 illustrates a cut-away side view of the printed wiring board 191 (which is taken along a line corresponding to line A2-A2 of FIG. 8) to which the separated lead frames 120A are bonded.

In the example of FIG. 14, the lead frames 120A are arranged apart from each other at a position 75 where the printed wiring board 191 is to be cut into separate wiring boards 110. Thus, it is apparent from FIG. 14 that the lead frames 120A are bonded to the printed wiring board 191 after they are separated.

In the first variation, the lead frames 120A each including the radiating part 127 are bonded to the printed wiring board 191 after being separated. However, the first variation may also be applied to the lead frames 120 that do not include the radiating part 127. For example, the lead frame sheet 118 may be cut into separate lead frames 120 and then the lead frames 120 may be bonded to the corresponding surfaces 110A of the printed wiring board 191 by holding the corner parts 126 using a mounting device.

Figure 15:
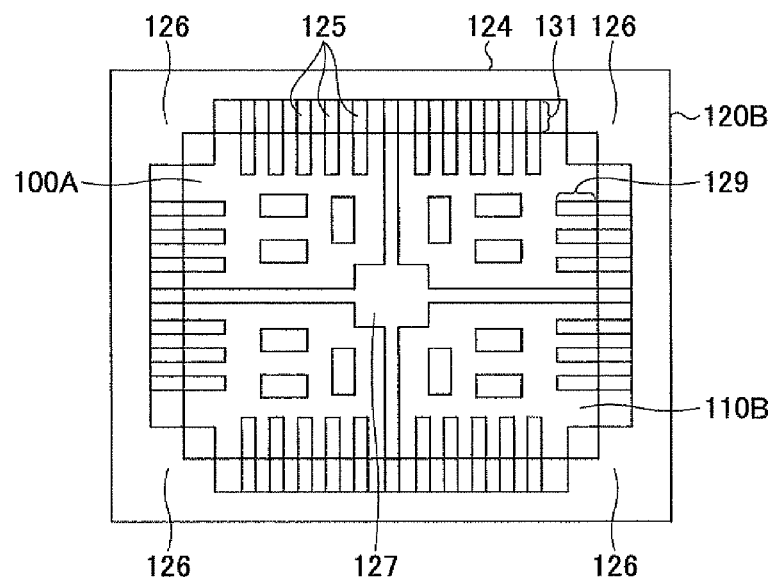
FIG. 15 is a drawing used to describe a second variation of the second embodiment.

FIG. 15 is a drawing used to describe a second variation of the second embodiment.

A lead frame 120B illustrated in FIG. 15 is formed such that the area in the frame 124 is greater than the area of the wiring board 110 of the electronic component module 100A. Each lead 125 of the lead frame 120B includes an inner lead 129 to be bonded to the back surface 110B of the wiring board 110 of the electronic component module 100A and an outer lead 131 that extends from the inner lead 129.

In the example of FIG. 15, plural lead frames 120B are formed in a lead frame sheet and only the inner leads 129 are separated from the lead frame sheet. Then, the inner leads are bonded to the corresponding back surface 110B of the printed wiring board 191. This method eliminates the need to take into account the space for the outer leads 131 when forming plural wiring boards 110 in the printed wiring board 191. Accordingly, this method makes it possible to densely form a large number of wiring boards 110 in the printed wiring board 191.

Third Embodiment

A third embodiment is described below with reference to the accompanying drawings. The third embodiment is different from the first embodiment in that components such as integrated circuits are formed on the back surface of a wiring board. Below, differences from the first embodiment are mainly described. Therefore, same reference numbers are assigned to components corresponding to those in the first embodiment, and their descriptions are omitted.

Figure 16:
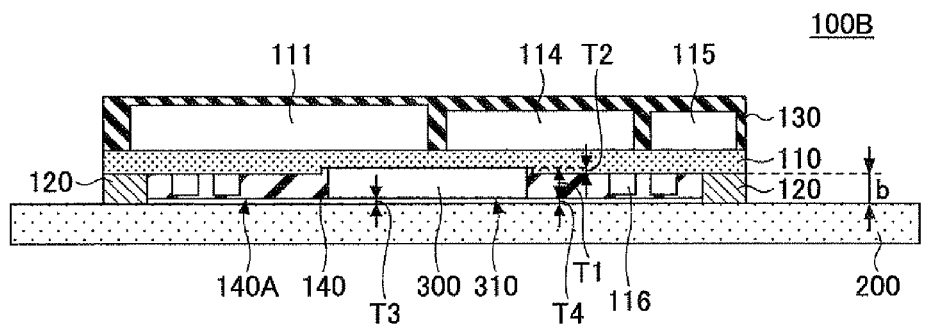
FIG. 16 is a first drawing illustrating an electronic component module according to a third embodiment.

FIG. 16 is a cut-away side view of an electronic component module 100B according to the third embodiment.

In the electronic component module 1008 of the third embodiment, a recess is formed in the back surface 110B of the wiring board 110 by counterboring and an integrated circuit 300 is mounted in the recess.

In the present embodiment, when the thickness of the integrated circuit 300 is T1 and the depth of the recess (or counterbore) is T2, the wiring board 110 is processed such that T1-T2≤b ("b" indicates the thickness of the lead frame 120) is satisfied.

The configuration of the third embodiment makes it possible to mount an integrated circuit with a thickness greater than the thickness "b" of the lead frame 120 on the back surface 110B of the wiring board 110.

Alternatively, when a distance between the main board 200 and a surface 310 of the integrated circuit 300 facing the main board 200 is T3 and a distance between the main board 200 and a surface 140A of the insulating resin 140 facing the main board 200 is T4, the depth T2 of the recess may be adjusted such that the distance T3 equals the distance T4 (T3=T4).

Figure 17:
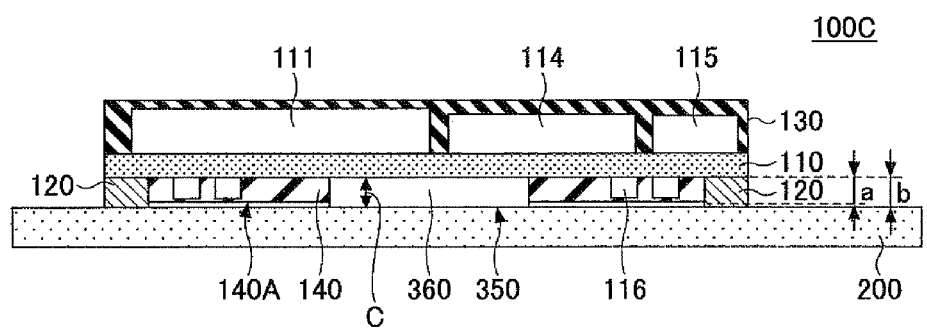
FIG. 17 is a second drawing illustrating an electronic component module according to the third embodiment.

FIG. 17 is a cut-away side view of an electronic component module 100C according to the third embodiment.

In the electronic component module 100C of the third embodiment, a component 350 that generates heat is mounted on the back surface 100B of the wiring board 110. For example, the component 350 is an integrated circuit. The component 350 is preferably one of components mounted on the electronic component module 100C that generates the largest amount of heat.

When the component 350 has a thickness "c", the thickness "b" of the lead frame 120 is preferably determined to satisfy "c=b". With this configuration, when the electronic component 100C is mounted on the main board 200, a surface 350 of the component 360 contacts the main board 200. With the surface 360 being in contact with the main body 200, heat generated by the component 350 is transferred to the main board 200.

To efficiently transfer the heat generated by the component 350, a heat conductive sheet or film may be formed on the surface 360. In this case, the thickness "b" of the lead frame 120 may be made smaller than the thickness "c" of the component 350 to take into account the thickness of the heat conductive sheet or film formed on the surface 360.

Fourth Embodiment

A fourth embodiment is described below with reference to the accompanying drawings. The fourth embodiment is different from the first embodiment in that a part of a lead frame is covered by an insulating resin. Below, differences from the first embodiment are mainly described. Therefore, same reference numbers are assigned to components corresponding to those in the first embodiment, and their descriptions are omitted.

Figure 18:
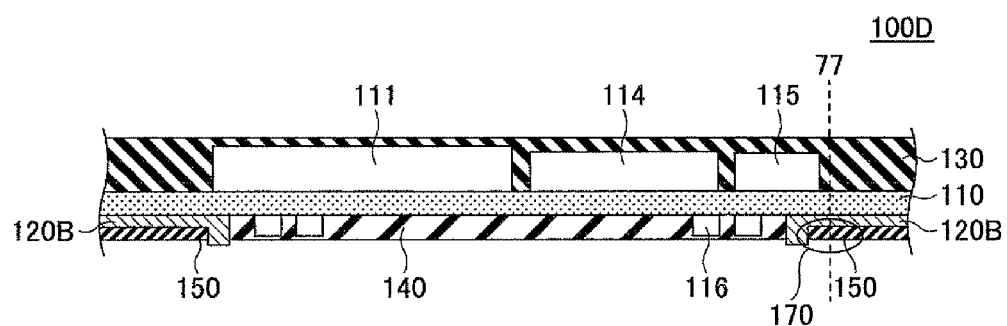
FIG. 18 is a first drawing illustrating an electronic component module according to a fourth embodiment.

FIG. 18 is a cut-away side view of an electronic component module 100D according to the fourth embodiment. In FIG. 18, it is assumed that components are mounted on the wiring board 110 and sealed by an insulating film and that the wiring board 110 has not been separated from other wiring boards 110 in the printed wiring board.

In the present embodiment, when components mounted on the back surface 110B of the wiring board 110 are sealed with an insulating resin, the frame 124, the corner parts 126, and a part of the leads 125 of the lead frame 120B are also sealed with the insulating resin. In FIG. 18, a part 170 corresponding to the frame 124, the corner parts 126, and a part of the leads 125 of the lead frame 120B is covered by an insulating resin 150. The printed wiring board is cut at a position 77 where the part 170 is covered by the insulating resin 150 to produce separate electronic component modules 100D.

Figure 19:
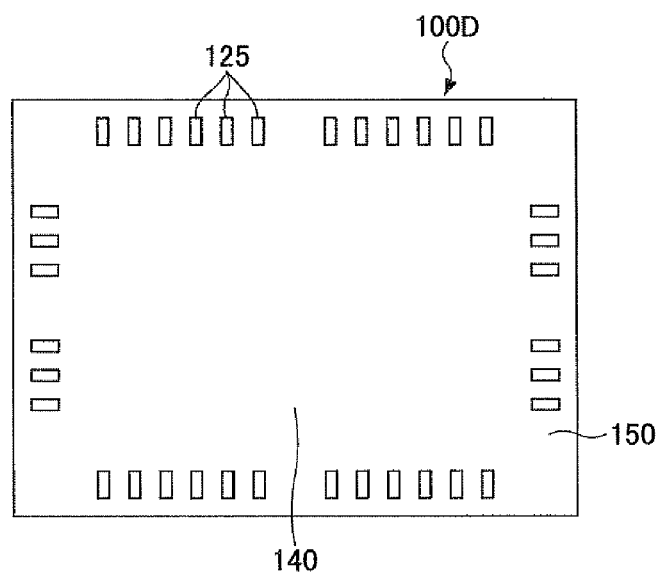
FIG. 19 is a bottom view of an electronic component module according to the fourth embodiment.

FIG. 19 is a bottom view of the electronic component module 100D according to the fourth embodiment. In the electronic component module 100D of the fourth embodiment, components are mounted in a space formed by the back surface 110E of the wiring board 110 and the lead frame 120B and sealed with the insulating resin 140. Also, the frame 124, the corner parts 126, and a part of the leads 125 are covered by the insulating resin 150. In the present embodiment, half etching is performed so that the lead frame 120B other than a part of the leads 125 is covered with the insulating resin 150.

Figure 20:
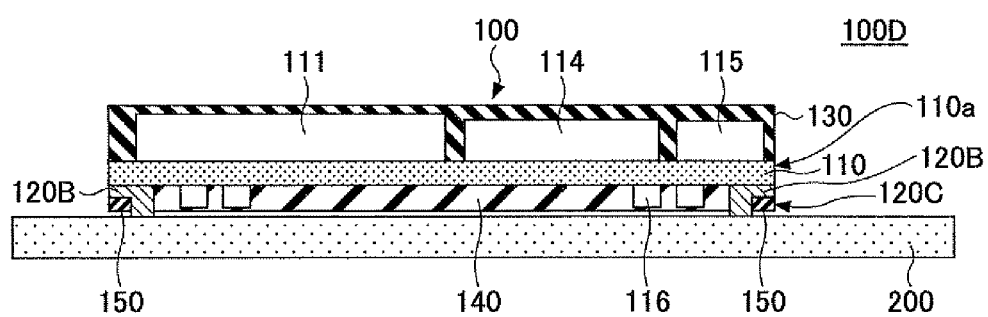
FIG. 20 is a second drawing illustrating an electronic component module according to the fourth embodiment.

FIG. 20 is a second drawing used to describe the fourth embodiment and illustrating a separate piece of the electronic component module 100D.

When the printed wiring board is cut into separate electronic component modules 100D as described above, the cut surface of each electronic component module 100D includes an insulating resin layer implemented by the insulating resin 150 and a conductive material layer implemented by the lead frame 120B between the wiring board 110 and the main board 200.

The cut surface is an end face of the electronic component module 100D. The end face of the electronic component module 100D includes an end face 110a of the wiring board 110, an end face of the insulating resin layer of the insulating resin 150, and an end face of the conductive material layer of the lead frame 120B.

Thus, in the fourth embodiment, a part of the lead frame 120B is covered by the insulating resin 150 to improve the bonding strength between the lead frame 120B and the wiring board 110.

Fifth Embodiment

A fifth embodiment is described below with reference to the accompanying drawings. The fifth embodiment is different from the first embodiment in the order in which a printed wiring board is cut into separate electronic component modules and in that a metal thin film used as a shield and a protective film for protecting the metal thin film are provided on each electronic component module. Below, differences from the first embodiment are mainly described. Therefore, same reference numbers are assigned to components corresponding to those in the first embodiment, and their descriptions are omitted.

Figure 21A:
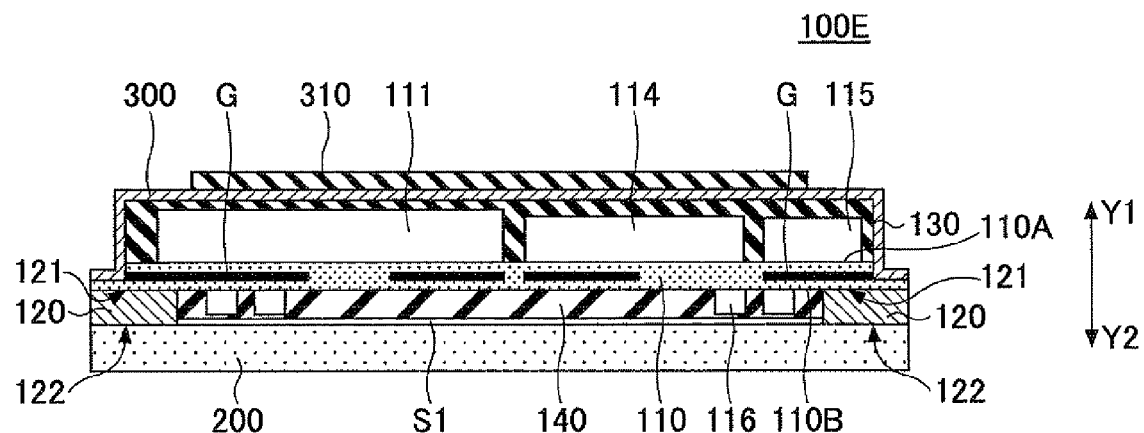
Figure 21B:
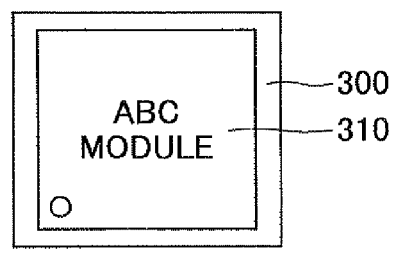

FIGS. 21A and 21B are drawings illustrating an electronic component module 100E according to the fifth embodiment. FIG. 21 (A) is a cut-away side view of the electronic component module 100E and FIG. 21 (B) is a top view of the electronic module 100E.

The electronic component module 100E of the fifth embodiment includes a metal thin film 300 that covers the insulating resin 130. The metal thin film 300 functions as a shield. The electronic component module 100E of the fifth embodiment also includes a protective film 310 formed on the shield 300. The shield 300 is in contact with a ground pattern G formed in a surface layer or an inner layer of the wiring board 110. On the protective film 310, information or a mark used, for example, to identify the electronic component module 100E is formed.

Next, a method of producing the electronic component module 100E of the fifth embodiment is described with reference to FIGS. 22A through 22F. FIGS. 22A through 22F are drawings used to describe a method of producing the electronic component module 100E according to the fifth embodiment. Although the configuration of the electronic component module 100E is simplified in FIGS. 22A through 22F, the electronic component module 100E has the same configuration as illustrated by FIGS. 21A and 21B.

Figure 22A:
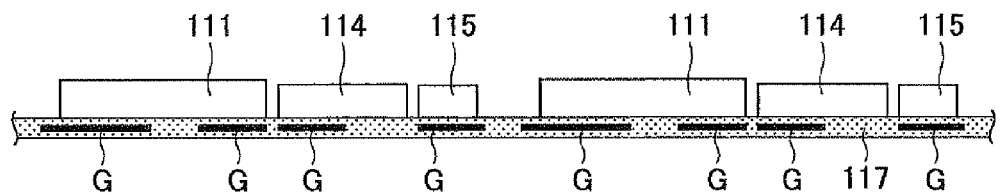
FIGS. 22A through 22F are drawings used to describe a method of producing an electronic component module according to the fifth embodiment.

In FIG. 22A, components are mounted on the front surface of the printed wiring board 117 that is an assembly of plural wiring boards 110. In the present embodiment, the printed wiring board 117 is cut into separate wiring boards 110. The ground pattern G is formed in the surface layer or the inner layer of the printed wiring board 117. The ground pattern G formed in the surface layer or the inner layer is connected, for example, to components formed on the wiring boards 110. When the printed wiring board 117 is cut into separate wiring boards 110, the ground pattern G is exposed at an end face 110a of each wiring board 110.

Figure 22B:
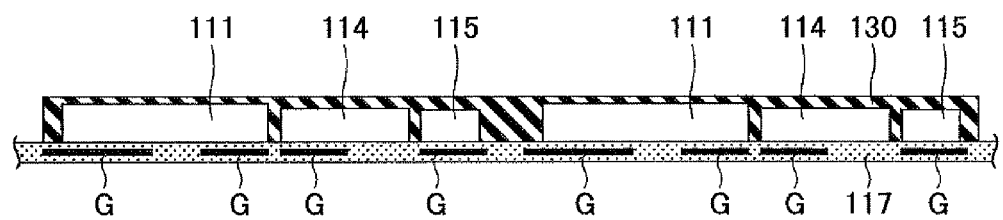

Although not shown, a step of bonding the lead frame sheet 118 to the back surface of the printed wiring board 117 may be inserted between the steps corresponding to FIGS. 22A and 22B.

In FIG. 22B, the components formed on the front surface of the printed wiring board 117 are covered by the insulating resin 130. In the present embodiment, after components are mounted on each of the wiring boards 110, the printed wiring board 117 is covered by the insulating resin 130.

Figure 22C:
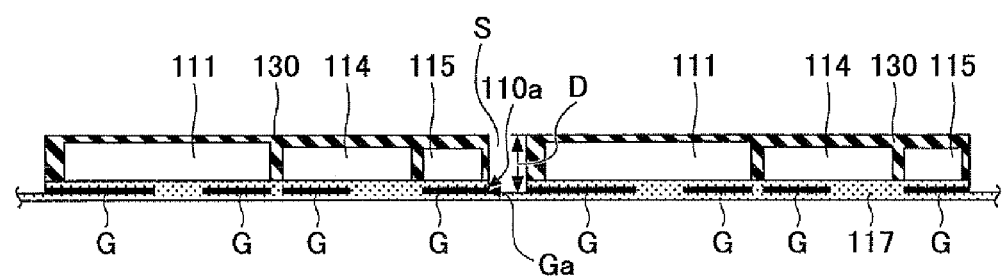

Then, as illustrated in FIG. 22C, the printed wiring board 117 covered by the insulating resin 130 is half-cut to form a groove S.

More specifically, the printed wiring board 117 is cut up to a depth where the ground pattern G is exposed on the end face 110a of the wiring board 110 to form the groove S. In the present embodiment, a depth D of the groove S is greater than or equal to a distance between the upper surface of the insulating resin 130 and a position where an end face Ga of the ground pattern G formed in the inner layer of the wiring board 110 is completely exposed.

Figure 22D:
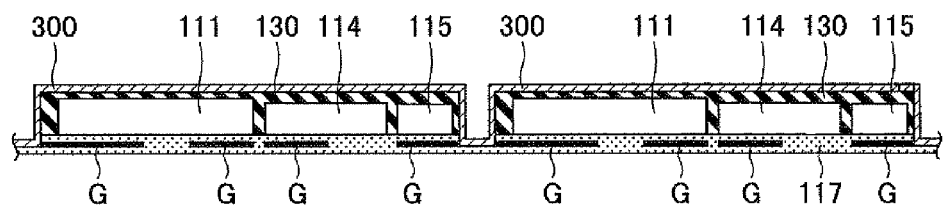

Next, as illustrated in FIG. 22D, the metal thin film 300 is formed to cover the upper and side surfaces of the insulating resin 130 and the end faces 110a of the wiring boards 110.

The metal thin film 300 may be formed, for example, by vacuum deposition (including ion plating) or sputtering. The metal thin film 300 may include one of aluminum, copper, gold, nickel, and iron. Preferably, the metal thin film 300 has a low evaporating temperature, can be easily deposited, and has a low specific resistance, excellent shielding characteristics, high thermal conductivity, and excellent radiation characteristics. For example, the metal thin film 300 may include a magnetic material such as nickel.

Figure 22E:
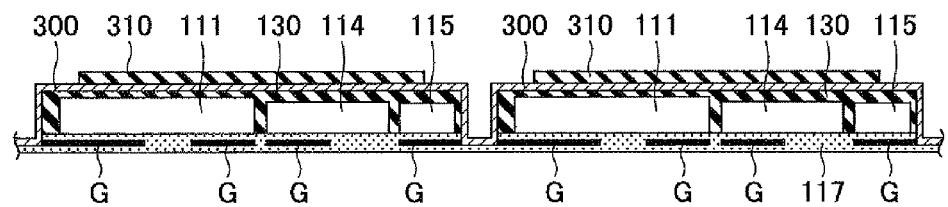

In the present embodiment, the metal thin film 300 is formed to cover the end face 110a of the wiring board 110. Accordingly, the metal thin film 300 and the end face Ga of the ground pattern G are connected to each other. Next, as illustrated in FIG. 22E, the protective film 310 is formed on the upper surface of the metal thin film 300.

The protective film 310 is an insulating film and may include, for example, a resist material with a dark brown color. The protective film 310 may be formed by printing.

Figure 23:
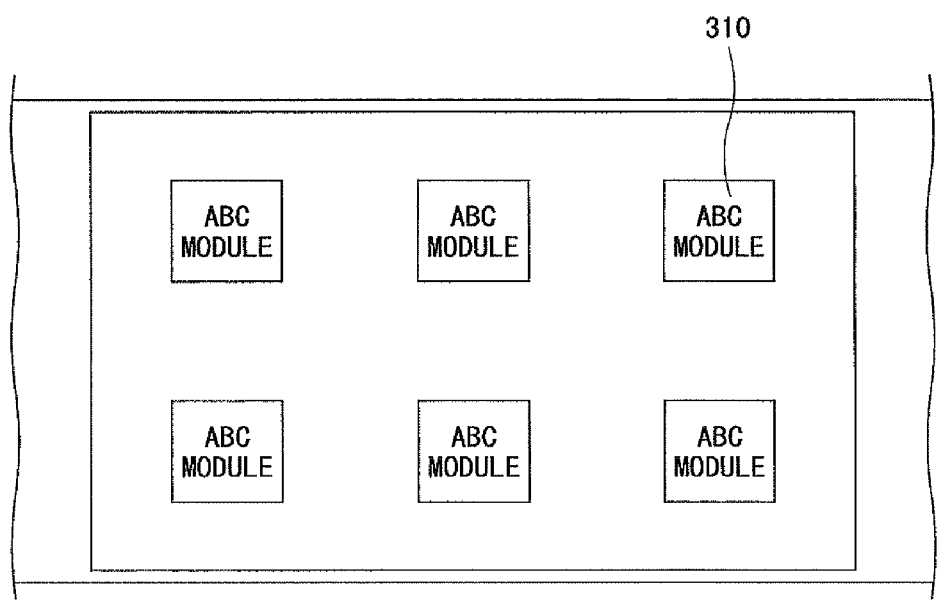
FIG. 23 is a drawing illustrating marked protection films.

After the protective film 310 is formed, information (or a mark) used to identify the electronic component module 100E is formed on the upper surface of the protective film 310 as illustrated in FIG. 23.

Using a dark-brown material for the protective film 310 makes it possible to improve the visibility of the mark formed on the protective film 310.

The mark may be formed with ink by, for example, silk-screen printing or offset printing. Alternatively, the mark may be formed by removing a part of the protective film 310 using a laser beam. In this case, the mark is formed by removing a part of the protective film 310 such that the mark does not pass through the protective film 310. This makes it possible to form the mark without damaging the metal thin film 300. Examples of the mark may include a 1 pin mark indicating the position of the 1 pin, a product number of the electronic component module 100E, a lot number, and a symbol (e.g., a two-dimensional barcode).

Figure 22F:
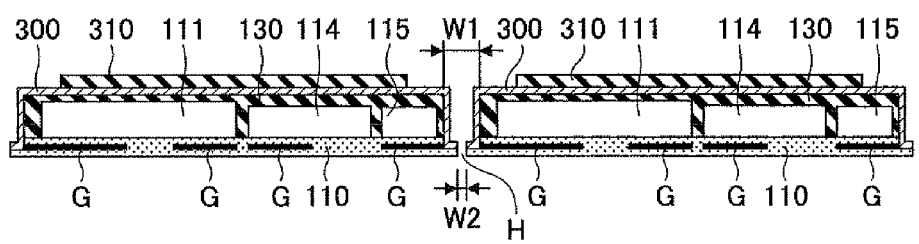

After forming the mark on the protective film 310, the printed wiring board 117 is cut into separate wiring boards 110 as illustrated in FIG. 22F.

More specifically, after the mark is formed on the protective film 31, a groove H is formed to pass through the bottom of the groove S to divide the printed wiring board 117 into separate wiring boards 110.

In the present embodiment, a width W1 of the groove S and a width W2 of the groove H are determined such that W1>W2 is satisfied. The difference between the width W1 and the width W2 is preferably from about 50 μm to about 200 μm. With W1>W2 satisfied, it is possible to form the groove H without damaging the side surfaces of the metal thin film 300.

The groove S may be formed from the upper surface of the insulating resin 130, and the groove H may be formed from the back surface of the printed wiring board 117. If the groove H is formed from the back surface 117B of the printed wiring board 117, the position of the groove H can be easily and accurately determined based on the dicing line determined by the alignment marks M2 formed on the back surface 117B of the printed wiring board 117.

Also, forming the groove H from the back surface 117B of the printed wiring board 117 prevents scraps generated when forming the groove H from touching the metal thin film 300 and the protective film 310 and thereby makes it possible to cut the printed wiring board 117 into separate wiring boards 110 without damaging the metal thin film 300 and the protective film 310.

Alternatively, the groove H may be formed from the bottom of the groove S toward the back surface 117B of the printed wiring board 117.

The electronic component module 100E including the metal thin film 300 functioning as a shield is produced as described above.

In the fifth embodiment, the metal thin film 300 is connected to the ground pattern G formed in a surface layer or an inner layer of the wiring board 110. This configuration makes it possible to strengthen the ground. Also, since the metal thin film 300 is connected to the ground pattern G, the metal thin film 300 provides excellent shielding effects and therefore makes it possible to more efficiently transfer heat from the electronic component module 100E.

Figure 24:
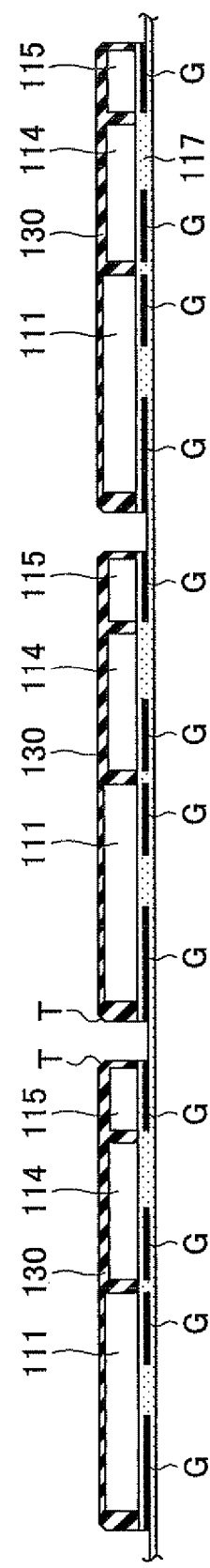
FIG. 24 is a drawing illustrating a groove whose edges are beveled.

According to the fifth embodiment, the edges of the groove S may be beveled before the metal thin film 300 is formed as illustrated in FIG. 24 (beveled edges are indicated by T in FIG. 24).

For example, the edges of the groove S may be beveled when the printed wiring board 117 is half-cut to form the groove S (see FIG. 22C).

Beveling the edges of the groove S makes it possible to improve the coatability of the metal thin film 300 on the side surfaces of the insulating resin 130.

As described above, according to the production method of the electronic component module 100E of the fifth embodiment, the protective film 310 is formed and the mark is formed on the protective film 310 before the printed wiring board 117 is diced. Compared with a method where the printed wiring board 117 is diced at an early stage of the production process, the fifth embodiment makes it possible to simplify the production process. Also, the fifth embodiment makes it possible to improve the production yield of the electronic component module 100E.

Sixth Embodiment

A sixth embodiment is described below with reference to the accompanying drawings. The sixth embodiment is different from the fifth embodiment in that even the side surfaces of a metal thin film are covered by a protective film. Below, differences from the fifth embodiment are mainly described. Therefore, same reference numbers are assigned to components corresponding to those in the fifth embodiment, and their descriptions are omitted.

Figure 25A:
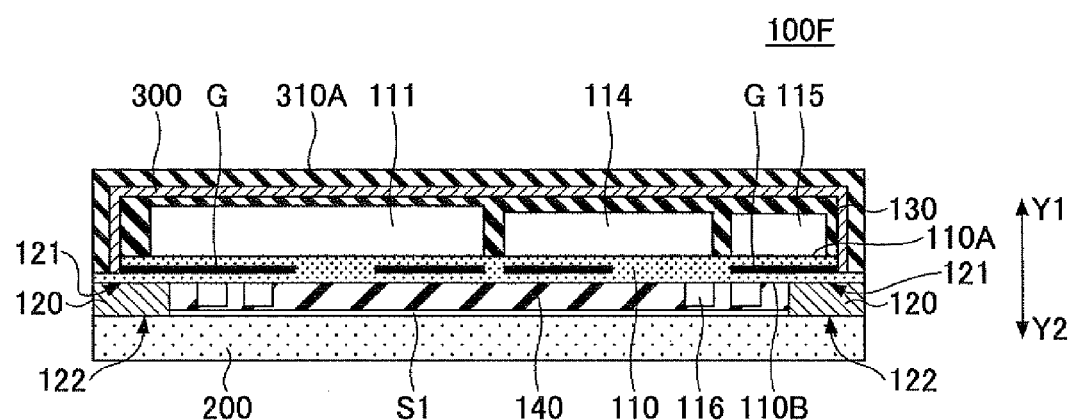
FIGS. 25A and 25B are drawings illustrating an electronic component module according to a sixth embodiment.
Figure 25B:
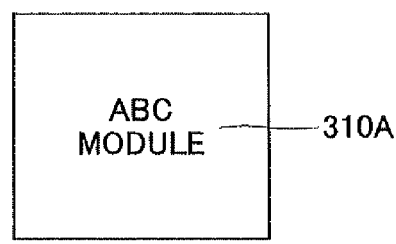

FIGS. 25A and 25B are drawings illustrating an electronic component module 100F according to the sixth embodiment. FIG. 25 (A) is a cut-away side view of the electronic component module 100F and FIG. 25 (B) is a top view of the electronic module 100F.

In the electronic component module 100F of the sixth embodiment, even the side surfaces of the metal thin film 300 are covered by a protective film 310A. As illustrated in FIG. 25B, a mark is formed on the upper surface of the protective film 310A covering the metal thin film 300.

Figure 26:
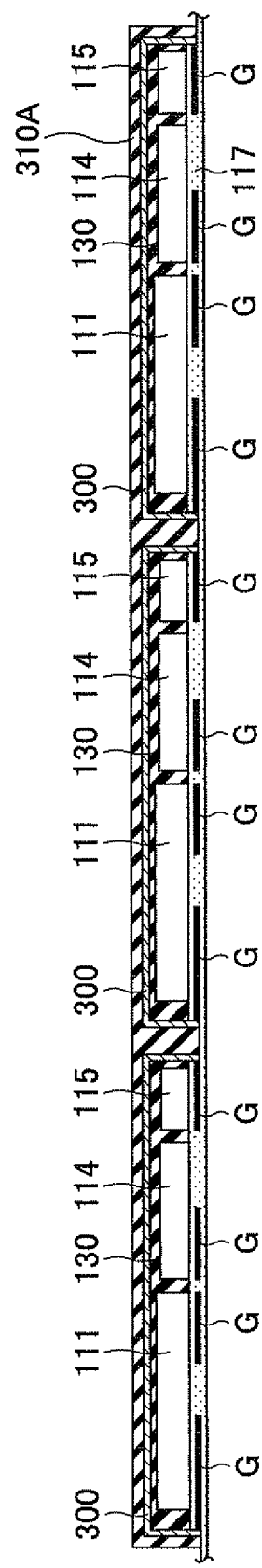
FIG. 26 is a drawing used to describe a method of producing an electronic component module according to the sixth embodiment.

FIG. 26 is a drawing used to describe a method of producing the electronic component module 100F according to the sixth embodiment. In the method of producing the electronic component module 100F of the sixth embodiment, the step corresponding to FIG. 22E is replaced with a step described below with reference to FIG. 26.

In the sixth embodiment, after the metal thin film 300 is formed in the step of FIG. 22D, the printed wiring board 117 is covered by the protective film 310A and the groove S formed by half-cutting the printed wiring board 117 is also filled with the protective film 310A.

For example, the protective film 310A may be formed by vacuum printing so that the printed wiring board 117 having the grooves S can be evenly covered by the protective film 310A.

In the sixth embodiment, the printed wiring board 117 is cut along the dicing lines defined by the alignment marks formed on the back surface 117B to produce separate wiring boards 11.

According to the sixth embodiment, since the side surfaces of the metal thin film 300 are also covered by the protective film 310A, it is possible to dice the printed wiring board 117 without damaging the side surfaces of the metal thin film 300.

Seventh Embodiment

A seventh embodiment is described below with reference to the accompanying drawings. The seventh embodiment is different from the fifth embodiment in the order in which a metal thin film is formed. Below, differences from the fifth embodiment are mainly described. Therefore, same reference numbers are assigned to components corresponding to those in the fifth embodiment, and their descriptions are omitted.

In the seventh embodiment, the printed wiring board 117 is diced after forming the groove S by half-cutting the printed wiring board 117, and then the protective film 310 is formed and a mark is formed on the protective film 310.

Figure 27A:
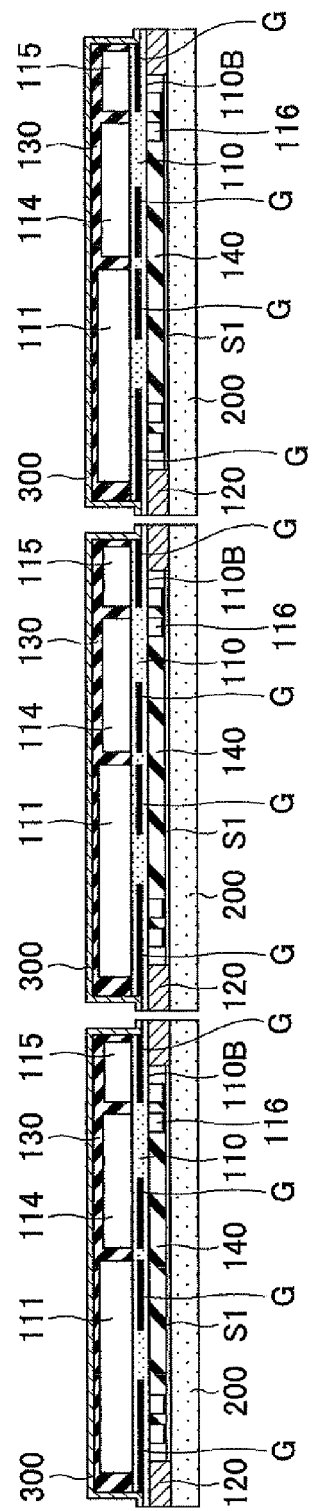
FIGS. 27A and 27B are drawings used to describe a method of producing an electronic component module according to a seventh embodiment.
Figure 27B:
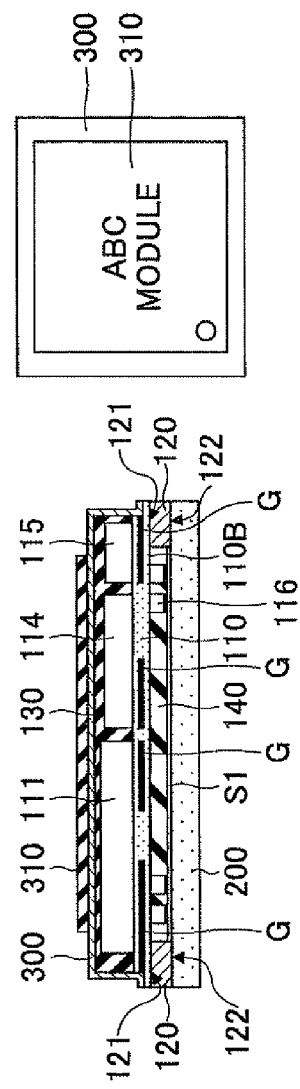

FIGS. 27A and 27B are drawings used to describe a method of producing an electronic component module according to the seventh embodiment. In the seventh embodiment, after the step corresponding to FIG. 22D is performed, the groove H is formed as illustrated in FIG. 27A from the back surface 117B of the printed wiring board 117 through the bottom of the groove S to dice the printed wiring board 117. Then, as illustrated in FIG. 27B, the protective film 310 is formed on the upper surface of the metal thin film 300.

The electronic component module produced according to the method of the seventh embodiment has the same shape as that of the electronic component module 100E of the fifth embodiment.

Electronic component modules and methods of producing the electronic component modules according to the embodiments are described above. However, the present invention is not limited to the specifically disclosed embodiments, and variations and modifications may be made without departing from the scope of the present invention.

An aspect of this disclosure makes it possible to provide an electronic component module with a reduced size and thickness and a method for producing the electronic component module.

What is claimed is:

1. An electronic component module, comprising:
   a double-sided mounting board having a front surface and a back surface;
   components mounted on the front surface and the back surface of the double-sided mounting board;
   an insulating resin sealing the components mounted on the front surface and the back surface; and
   a lead frame bonded to a terminal formed on the back surface of the double-sided mounting board,
   wherein the back surface of the double-sided mounting board is sealed with the insulating resin such that the lead frame is not covered by the insulating resin; and
   wherein a thickness of the insulating resin sealing the components mounted on the back surface of the double-sided mounting board is less than or equal to a thickness of the lead frame.

2. The electronic component module as claimed in claim 1, wherein a first contact surface of the lead frame bonded to the terminal formed on the back surface of the double-sided mounting board and a second contact surface of the lead frame to be bonded to a main board overlap each other in a vertical direction.

3. The electronic component module as claimed in claim 1, wherein the lead frame includes
   leads configured to connect the components mounted on the back surface to a main board;
   a frame that is monolithically formed with the leads; and
   a radiating part formed within the frame.

4. The electronic component module as claimed in claim 2, wherein an end face of the electronic component module includes an insulating resin layer implemented by the insulating resin and a conductive material layer implemented by the lead frame between the double-sided wiring board and the main board.

* * * * *